United States Patent

Roselle et al.

[11] Patent Number: 5,114,872
[45] Date of Patent: May 19, 1992

[54] FORMING PLANAR ITO GATE ELECTRODE ARRAY STRUCTURES

[75] Inventors: Paul L. Roselle, Webster; Stephen L. Kosman; Patricia A. Mahns, both of Rochester, all of N.Y.

[73] Assignee: Eastman Kodak Company, Rochester, N.Y.

[21] Appl. No.: 663,996

[22] Filed: Mar. 4, 1991

[51] Int. Cl.$^5$ .................................. H01L 21/302
[52] U.S. Cl. ..................................... 437/48; 437/50; 437/69; 437/181; 437/968; 148/DIG. 106
[58] Field of Search ............... 437/50, 181, 968, 69, 437/48; 148/DIG. 106

[56] References Cited

U.S. PATENT DOCUMENTS

| | | |
|---|---|---|
| 4,812,418 | 3/1989 | Pfiester et al. .................. 437/69 |
| 4,878,993 | 11/1989 | Rossi et al. ..................... 156/643 |
| 4,986,879 | 1/1991 | Lee ................................. 437/69 |

FOREIGN PATENT DOCUMENTS 62-291943 12/1987 Japan .

Primary Examiner—Brian E. Hearn
Assistant Examiner—Laura M. Holtzman
Attorney, Agent, or Firm—Raymond L. Owens

[57] ABSTRACT

A method of forming a planar ITO gate electrode structure with sub-micron spacing includes forming L-shaped nitride spacer portions.

1 Claim, 5 Drawing Sheets

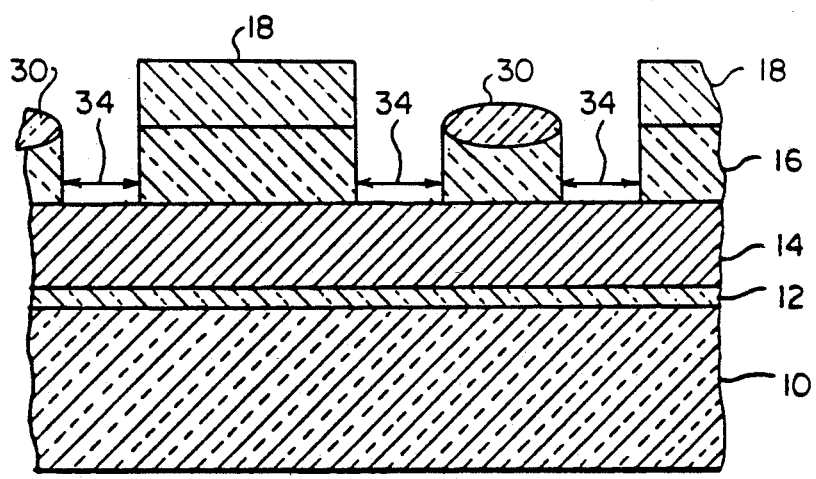
FIG. 1j
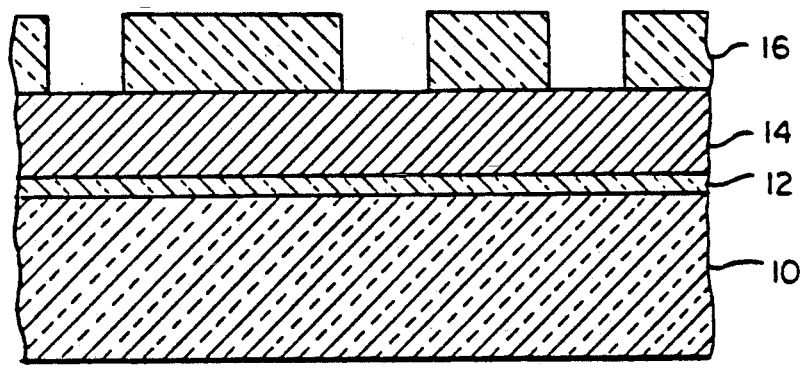
FIG. 1k
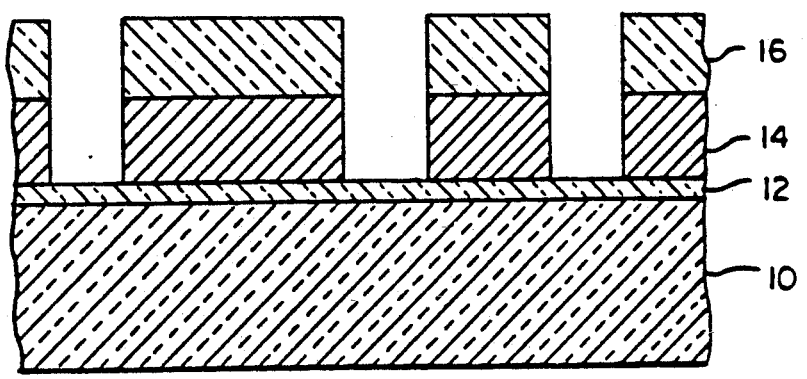
FIG. 1ℓ

FORMING PLANAR ITO GATE ELECTRODE ARRAY STRUCTURES

FIELD OF THE INVENTION

The present invention relates to forming planar indium tin oxide (ITO) gate electrode array structures.

BACKGROUND OF THE INVENTION

Solid state CCD image sensors often employ a double polysilicon gate structure to form a gate electrode array structure. Such a structure has first polysilicon gate electrodes separated from second polysilicon gate electrodes by a thin insulating layer of silicon dioxide. The first polysilicon electrode is slightly overlapped by the second polysilicon electrode. The systematic variations of potential applied to these electrodes, referred to as clocking, permits the device to function. In the case of a frame transfer CCD image sensor, light passes through the polysilicon electrodes and creates electronic hole pairs in the underlying silicon. By clocking electrodes, the accumulated electrons are moved under adjacent electrodes. Light must pass through the polysilicon electrodes in order to accumulate charge. However, polysilicon is not entirely transparent. This lack of transparency results in the reduction of sensitivity and spectral response of the image sensor.

Due to its transparency, it has been recognized that indium tin oxide would be an effective electrode for such a device. The use of indium tin oxide electrodes enhances the blue response and overall sensitivity of a frame transfer image sensor. In fact, it has been recognized that if indium tin oxide were to be used in such a device, the effective ASA of the device could be increased by as much as a factor of two. One reason that indium tin oxide has not been used on such devices is because it is difficult to pattern such materials. Indium tin oxide gate electrode structures are generally not effective in schemes which use overlapping gate electrodes. This is due to the fact that generally the first gate electrode needs to provide isolation from the second gate electrode and ITO does not oxidize to produce an insulating layer.

Of course, if an ITO planar gate electrode CCD image sensor could be provided, then the electrodes would not need to overlap. Also, there would be no need to oxidize the gate material for electrical insulation. All that would be necessary would be to deposit a dielectric which provides isolation of the gates from metal interconnects.

The difficulty in creating ITO planar electrode structures for CCD applications, is in the patterning of sub-micron gaps between ITO gates. For a planar ITO gate CCD to function, the gate electrodes must be easily spaced at a sub-micron distance in order to assure effective charge transfer efficiency.

SUMMARY OF THE INVENTION

It is therefore an object of this invention to provide a method of forming planar ITO gate electrode structures wherein the gate ITO electrodes are evenly spaced at sub-micron distances.

In accordance with this invention the above object is achieved in a method of forming a planar ITO gate electrode array structure with sub-micron spacing between such electrode gates, comprising the steps of:

(a) sequentially providing layers of ITO, polysilicon and LTO oxide;

(b) patterning the LTO layer to form spaced LTO structures which have rectangular cross-sections and exposing the surface of the polysilicon layer between such spaced LTO structures;

(c) forming a conformal thin nitride layer on the exposed polysilicon and the LTO structures;

(d) forming a conformal oxide layer on the thin nitride layer;

(e) anisotropically etching the oxide layer and nitride layer to expose the poly layer and the top surface of the LTO structures while leaving oxide spacers over L-shaped nitride portions between such structures;

(f) removing the oxide spacers leaving L-shaped nitride portions between the LTO structures;

(g) oxidizing the exposed polysilicon between the L-shaped nitride portions;

(h) removing the L-shaped nitride portions providing sub-micron openings between the LTO and the oxidized polysilicon;

(i) anisotropically etching the polysilicon down to the ITO layer through the sub-micron openings formed between the LTO structures and the oxidized polysilicon;

(j) removing the LTO structures and the oxidized polysilicon;

(k) anisotropically etching the ITO through the sub-micron openings formed between the polysilicon; and (l) removing the polysilicon layer leaving a planar ITO gate electrode array structure.

DESCRIPTION OF THE PREFERRED EMBODIMENT

With reference to FIGS. 1a–m, a method of forming planar ITO gate electrode array structures with submicron spacing between such ITO gates is described.

Figure 1A:
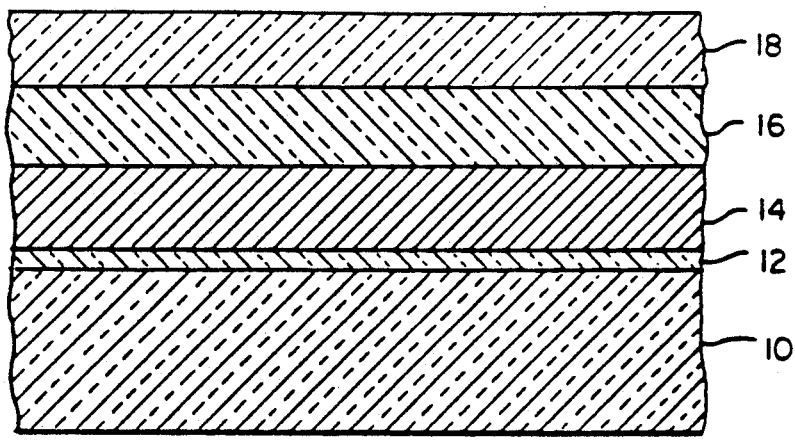
FIGS. 1a–n show various steps in forming a planar ITO gate electrode array structure in a method in accordance with the present invention.

FIG. 1a shows a silicon substrate (10) on which a gate oxide (12) is grown by thermal oxidation of the silicon substrate. On top of this gate oxide (12) a layer of indium tin oxide (ITO) (14) is sputter deposited. Next, a layer of doped polysilicon (16) is deposited usually by a chemical vapor deposition (CVD) process, onto the ITO layer (14). Finally, a low temperature oxide layer LTO (18) is deposited, also by a chemical vapor deposition (CVD) or by a plasma enhanced-chemical vapor deposition (PE-CVD) process on top of the polysilicon layer (16).

Figure 1B:
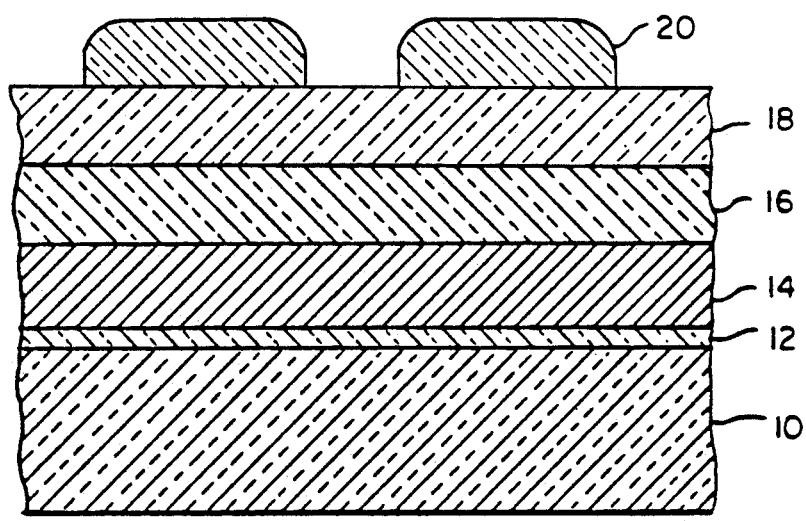
Figure 1C:
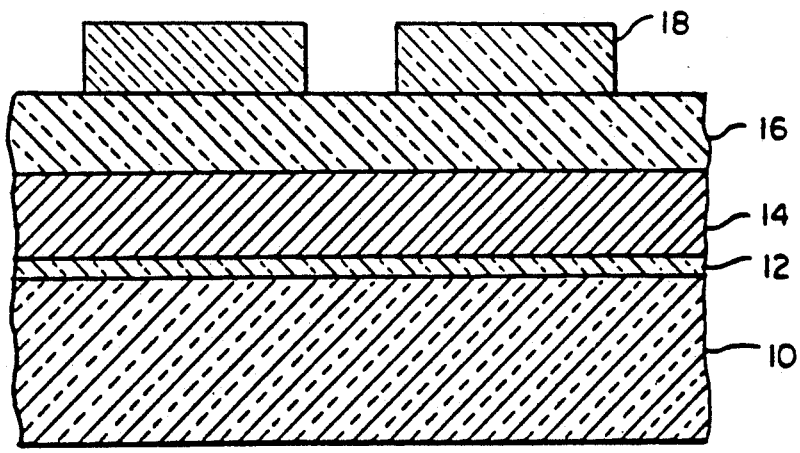
Figure 1D:
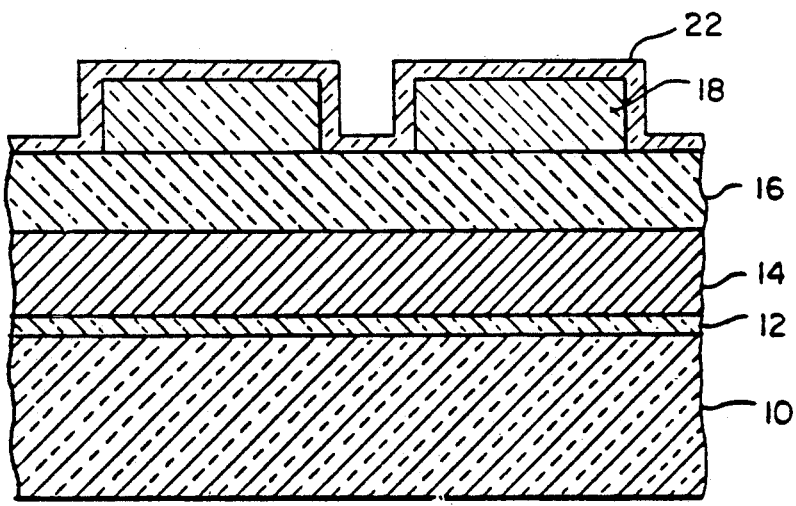
Figure 1E:
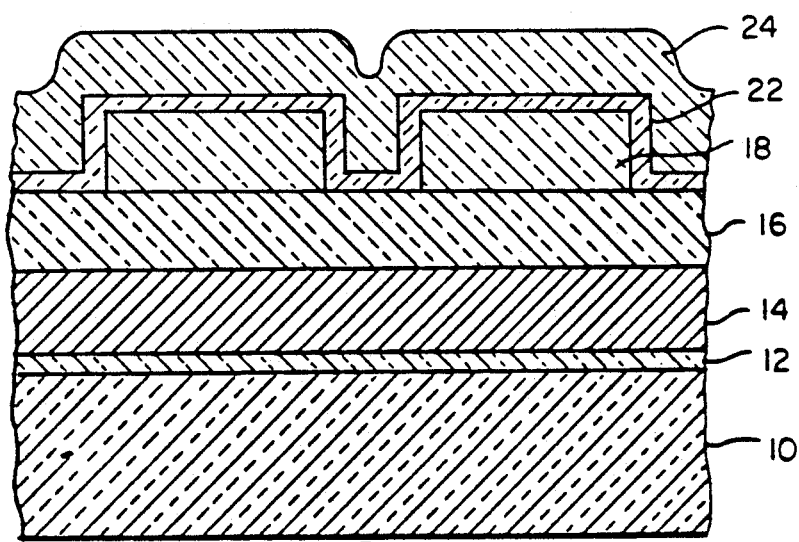
Figure 1F:
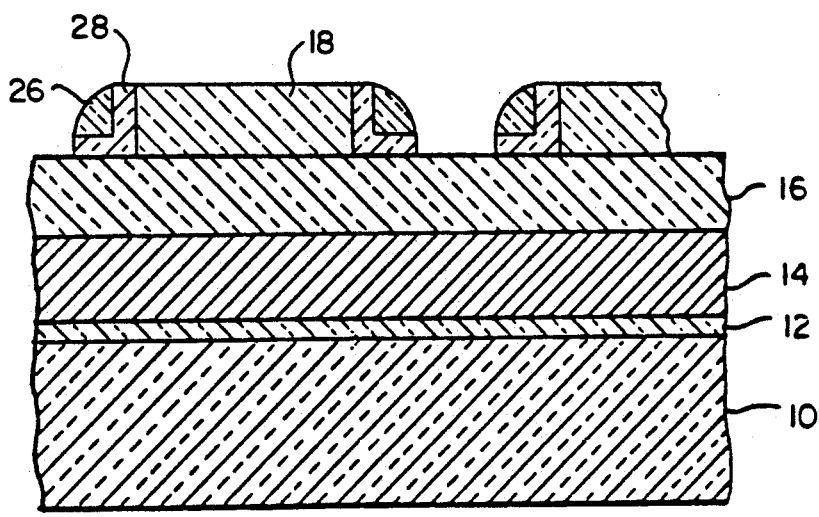

In FIG. 1b, a photolithographic mask (20) is coated, exposed, and developed on the LTO (layer (18) exposing portions of the LTO. In FIG. 1c these exposed portions of the LTO (18) have been anisotropically plasma etched away and the photoresist oxygen stripped off. Such a plasma etch of the LTO needs to be selective to the underlying polysilicon (16). A typical LTO plasma etch utilized $CHF_3$ gas and $C_2F_6$ gas and is commonly used. After patterning LTO structures remain. Overtop of these etched LTO structures (18), in FIG. 1d, a thin conformal layer of silicon nitride (22) is deposited. Silicon nitride can be deposited using CVD, plasma CVD, or some other deposition scheme. This is followed by FIG. 1e where the silicon nitride layer (22) is covered by a thick conformal layer of LTO (24) deposited by CVD or PE-CVD processes. An anisotropic LTO plasma etch, identical to the one used above and which has been found to also etch silicon nitride, is used to form spacers of LTO (26) and L-shaped nitride portions (28) as seen in FIG. 1f. These L-shaped nitride portions are found to be symmetric in the vertical and horizontal directions. This symmetry permits the tuning of the horizontal length by varying the height of the LTO structures (18) along which the L-shaped nitride portions are formed.

Figure 1G:
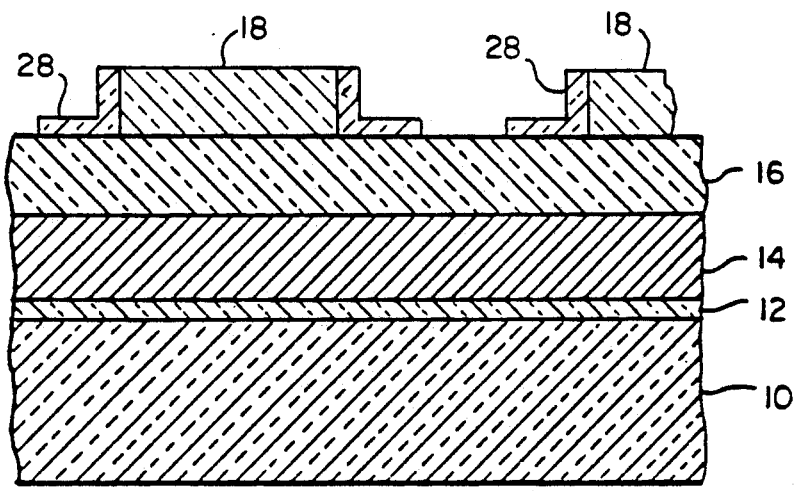
Figure 1H:
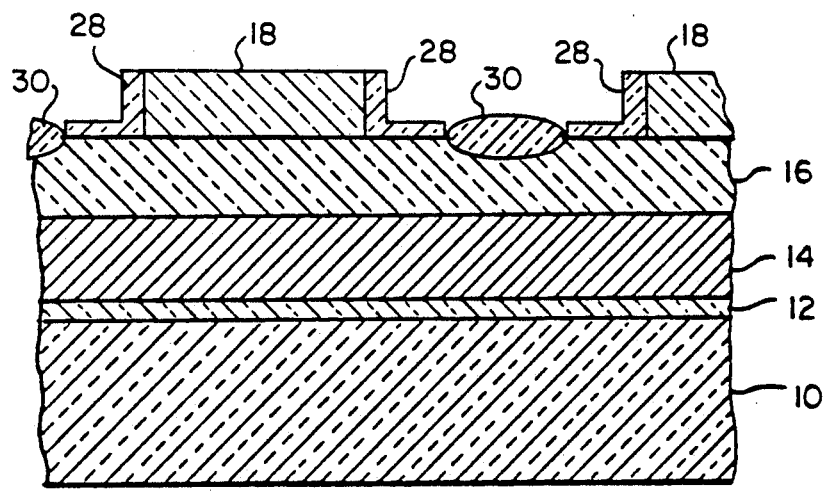
Figure 1I:
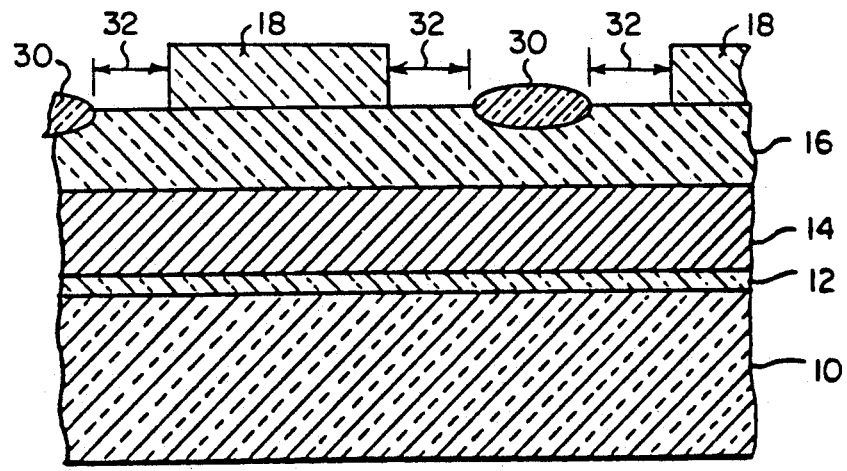

FIG. 1g shows the L-shaped nitride portions (28) after the LTO spacer has been removed by a wet oxide etch such as a buffered oxide etch (BOE). FIG. 1h shows the local oxidation of the surface of the exposed polysilicon (16) to create alternating lines of oxide and nitride. Local oxidation of poly is a wet oxidation process. FIG. 1i shows that the L-shaped nitride portions have been removed by a wet silicon nitride etch (155° C. hot phosphoric acid) to create open regions (32) on the surface of the polysilicon (16) between the LTO structures (18) and the LOCOS (30).

FIG. 1j shows the transfer of the open regions on the surface of the poly down into the poly layer (16) to form open spaces (34) on the ITO layer (14). This is done with an anisotropic polysilicon plasma etch such as a well known $CL_2$ based process used. This etch uses the LTO (18) and LOCOS (30) as an etch mask.

FIG. 1k shows the structure after the oxide masks have been removed by a wet oxide etch such as BOE.

FIG. 1l shows the transfer of the polysilicon patterned layer into the ITO layer (14) using the poly as the etch mask. This is accomplished with an anisotropic plasma ITO etch using $CH_4$ and Ar which etches ITO but is selective to poly and oxide.

Figure 1M:
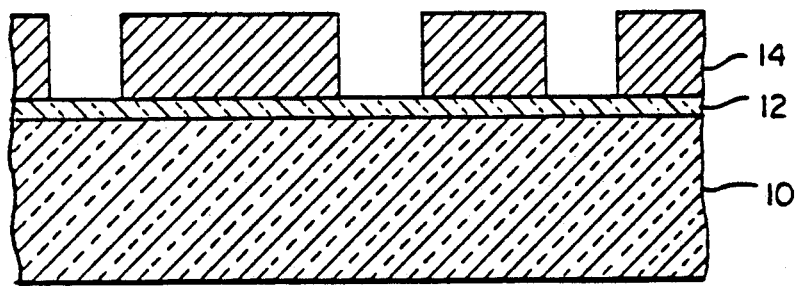

FIG. 1m shows the final structure of ITO gates (18) on gate oxide (12) separated by submicron gaps with the polysilicon removed.

LTO spacers and L-shaped nitride portions were formed with both of the following processes.

The first process used was performed on a Tegal Corp. 903e oxide etcher. The process parameters used were flows of 15 sccm of $C_2F_6$ gas, 40 sccm of $CHF_3$ gas, 30 sccm of He gas at a pressure of 1.5 Torr and rf plasma power of 375W.

A second process used to form the LTO spacers and L-shaped nitride portions was performed on an Applied Materials 8110 oxide etcher. The process parameters used were flows of 75 sccm of $CHF_3$ gas, 6 sccm of $O_2$ gas at a pressure of 50 millitorr and rf plasma voltage of 550 volts DC.

In both cases LTO spacers and L-shaped nitride portions were formed along side the LTO structures. The L-shaped nitride portions were symmetrical in the horizontal and vertical directions and the dimensions were actually varied by varying the height of the LTO structures.

ADVANTAGES OF THE INVENTION

It is a feature of this invention that the sub-micron gap formed between the ITO gate electrodes can be changed by simply varying the thickness of the LTO structures. By making the LTO thicker, the L-shaped nitride portions will of course be wider, and hence the gap will increase. Conversely, the thinner the LTO structures, the narrower L-shaped nitride portions and hence the narrower the gap formed between the gate electrodes.

The invention has been described in detail with particular reference to a certain preferred embodiment thereof, but it will be understood that variations and modifications can be effected within the spirit and scope of the invention.

We claim:

1. A method of forming a planar ITO gate electrode array structure with sub-micron spacing between such ITO gates, comprising the steps of:
    a sequentially providing layers of ITO, polysilicon and LTO oxide;
    (b) patterning the LTO layer to form spaced LTO structures which have rectangular cross-sections and exposing the surface of the polysilicon layer between such spaced LTO structures;
    (c) forming a conformal thin nitride layer on the exposed polysilicon and the LTO structures;
    (d) forming a conformal oxide layer on the thin nitride layer;
    (e) anisotropically etching the oxide layer and nitride layer to expose the poly layer and the top surface of the LTO structures while leaving oxide spacers over L-shaped nitride portions between such structures;
    (f) removing the oxide spacers leaving L-shaped nitride portions between the LTO structures;
    (g) oxidizing the exposed polysilicon between the L-shaped nitride portions;
    (h) removing the L-shaped nitride portions providing sub-micron openings between the LTO and the oxidized polysilicon;
    (i) anisotropically etching a polysilicon down to the ITO layer through the sub-micron openings formed between the LTO structures and the oxidized polysilicon;
    (j) removing the LTO structures and the oxidized polysilicon;
    (k) anisotropically etching the ITO through the sub-micron openings formed between the polysilicon; and
    (l) removing the polysilicon layer leaving a planar ITO gate electrode array structure.

* * * * *